United States Patent
Shu et al.

(10) Patent No.: US 10,742,167 B2
(45) Date of Patent: *Aug. 11, 2020

(54) DUAL-MODE OSCILLATOR AND MULTI-PHASE OSCILLATOR

(71) Applicant: Huawei Technologies Co., Ltd., Shenzhen (CN)

(72) Inventors: Yiyang Shu, Chengdu (CN); Huizhen Qian, Chengdu (CN); Xun Luo, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/563,283

(22) Filed: Sep. 6, 2019

(65) Prior Publication Data

US 2020/0007081 A1 Jan. 2, 2020

Related U.S. Application Data

(63) Continuation of application No. 15/714,619, filed on Sep. 25, 2017, now Pat. No. 10,498,289.

(30) Foreign Application Priority Data

Nov. 4, 2016 (CN) .......................... 2016 1 0966245

(51) Int. Cl.
*H03B 5/02* (2006.01)
*H03B 5/12* (2006.01)
*H03B 27/00* (2006.01)

(52) U.S. Cl.
CPC ............. *H03B 5/02* (2013.01); *H03B 5/1212* (2013.01); *H03B 5/1218* (2013.01);
(Continued)

(58) Field of Classification Search
CPC ...... H03B 5/02; H03B 5/1212; H03B 5/1265; H03B 5/1296; H03B 5/1218;
(Continued)

(56) References Cited

U.S. PATENT DOCUMENTS 3,061,797 A  10/1962  Grenier
7,649,424 B2  1/2010  Cusmai et al.
(Continued)

FOREIGN PATENT DOCUMENTS

CN   1960164 A    5/2007
CN   103299541 B  6/2016
(Continued)

OTHER PUBLICATIONS

Machine Translation and Abstract of Chinese Publication No. CN1960164, May 9, 2007, 15 pages.
(Continued)

*Primary Examiner* — Jeffrey M Shin
(74) *Attorney, Agent, or Firm* — Conley Rose, P.C.

(57) ABSTRACT

A dual-mode oscillator and a multi-phase oscillator includes a mode switching circuit to switch between two operating modes and obtain oscillation signals having two different bands. The dual-mode oscillator also includes two transformer-coupled oscillators with each having a step-up transformer. The step-up transformer multiplies a drain voltage swing of a first metal oxide semiconductor (MOS) transistor and then injects a voltage signal to a gate of a second MOS transistor to obtain a larger gate voltage swing without increasing a supply voltage of the oscillator. The dual-mode oscillators are coupled through multi-phase coupled circuits to form a Mobius loop.

20 Claims, 11 Drawing Sheets

(52) U.S. Cl.
CPC ......... *H03B 5/1228* (2013.01); *H03B 5/1243* (2013.01); *H03B 5/1265* (2013.01); *H03B 5/1296* (2013.01); *H03B 27/00* (2013.01); *H03B 2200/009* (2013.01); *H03B 2200/0074* (2013.01); *H03B 2201/0266* (2013.01)

(58) Field of Classification Search
CPC ................ H03B 5/1228; H03B 5/1243; H03B 2200/009; H03B 2200/0074
See application file for complete search history.

(56) References Cited

U.S. PATENT DOCUMENTS

| | | | |
|---|---|---|---|
| 2010/0271086 | A1 | 10/2010 | Bao et al. |
| 2012/0161890 | A1 | 6/2012 | Li et al. |
| 2013/0296217 | A1 | 11/2013 | Afshari et al. |
| 2014/0077890 | A1 | 3/2014 | Babaie et al. |
| 2014/0292419 | A1 | 10/2014 | Ragonese et al. |
| 2014/0320215 | A1 | 10/2014 | Staszewski et al. |
| 2018/0131323 | A1* | 5/2018 | Shu .......................... H03B 5/02 |

FOREIGN PATENT DOCUMENTS

| | | |
|---|---|---|
| WO | 2012054826 A1 | 4/2012 |
| WO | 2016054614 A1 | 4/2016 |
| WO | 2016119823 A1 | 8/2016 |
| WO | 2016119824 A1 | 8/2016 |

OTHER PUBLICATIONS

Wu, Q., et al., "A 10mW 37.8GHz Current-Redistribution BiCOMS VCO with an Average FOMT of −193.5dBc/Hz," ISSCC Dig. Tech. Papers, Feb. 2013, pp. 150-152.

Shin, D., et al., "A Mixed-Mode Injection Frequency-Locked Loop for Self-Calibration of Injection Locking Range and Phase Noise in 0.3um CMOS," ISSCC Dig. Tech. Papers, Feb. 2016, pp. 50-52.

Mammei, E., et al., "A 33.6-to-46.2GHz 32nm CMOS VCO with 177.5dBc/Hz Minimum Noise FOM Using Inductor Splitting for Tuning Extension," ISSCC Dig. Tech. Papers, Feb. 2013, pp. 350-352.

Li, G., et al., "A Low-Phase-Noise Wide-Tuning-Range Oscillator Based on Resonant Mode Switching," IEEE Journal of Solid-State Circuits, vol. 47, No. 6, Jun. 2012, pp. 1295-1308.

Jia, H., et al., "A 47.6-71.0-GHz 65-nm CMOS VCO Based on Magnetically Coupled π-Type LC Network," IEEE Transactions on Microwave Theory and Techniques, vol. 63, No. 5, May 2015, 13 pages.

Vigilante, M., et al., "Analysis and Design of an E-Band Transformer-Coupled Low-Noise Quadrature VCO in 28-nm CMOS," IEEE Transactions on Microwave Theory and Techniques, vol. 64, No. 4, Apr. 2016, 11 pages.

Li, G., et al., "A Low-Phase-Noise Multi-Phase Oscillator Based on Left-Handed LC-Ring," IEEE Journal of Solid-State Circuits, vol. 45, No. 9, Sep. 2010, 12 pages.

Dooghabadi, M., et al., "Multiphase Signal Generation Using Capacitive Coupling of LC-VCOs," 2007 IEEE International Conference on Electronics, Circuits and Systems, 2007, pp. 1087-1090.

Foreign Communication From a Counterpart Application, European Application No. 17191767.7, Partial European Search Report dated Mar. 29, 2018, 14 pages.

Foreign Communication From a Counterpart Application, Korean Application No. 10-2017-0132777, Korean Office Action dated Sep. 12, 2018, 10 pages.

Foreign Communication From a Counterpart Application, Korean Application No. 10-2017-0132777, English Translation of Korean Office Action dated Sep. 12, 2018, 7 pages.

Foreign Communication From a Counterpart Application, Chinese Application No. 201610966245.9, Chinese Office Action dated Feb. 11, 2019, 8 pages.

Jang, S., et al. "A Low Voltage and Low Power Bottom-Series Coupled Quadrature VCO," IEEE Microwave and Wireless Components Letters, vol. 19, No. 11, Nov. 2009, pp. 722-724.

* cited by examiner

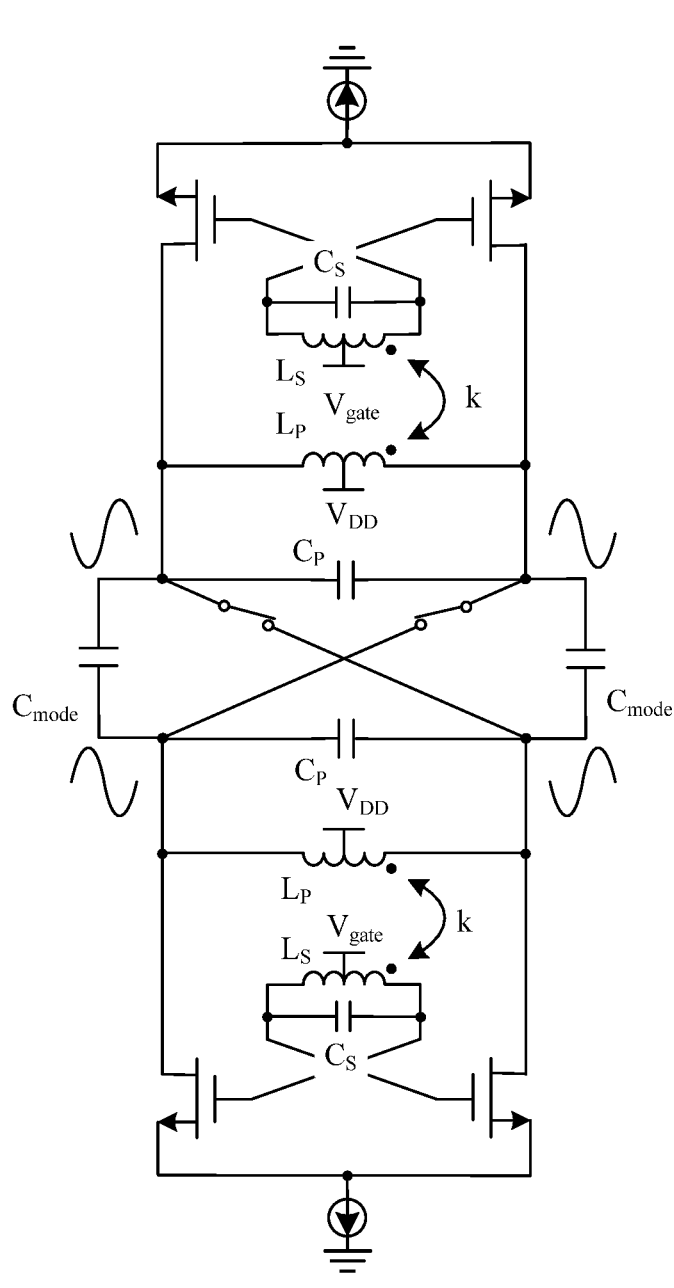
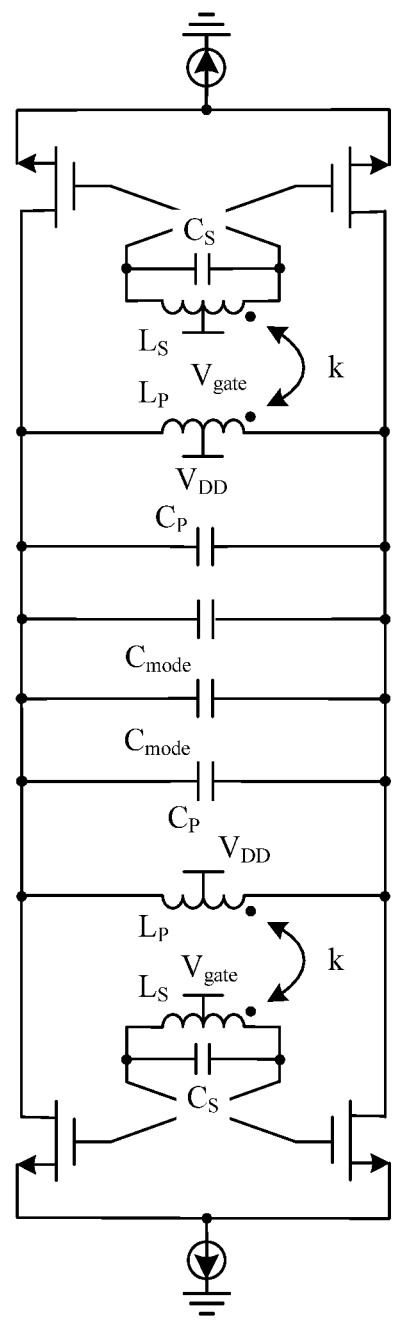
FIG. 4A
FIG. 4B

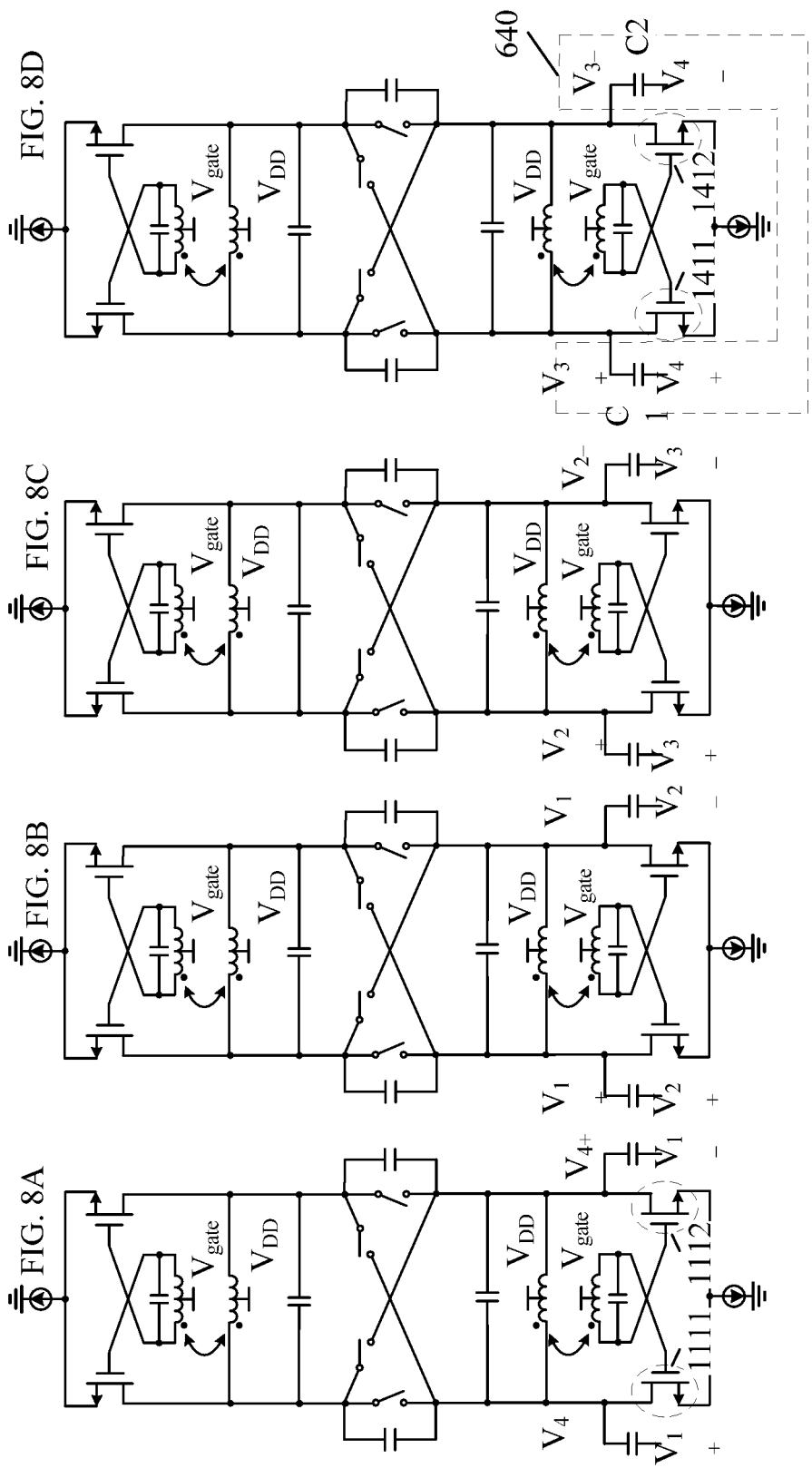

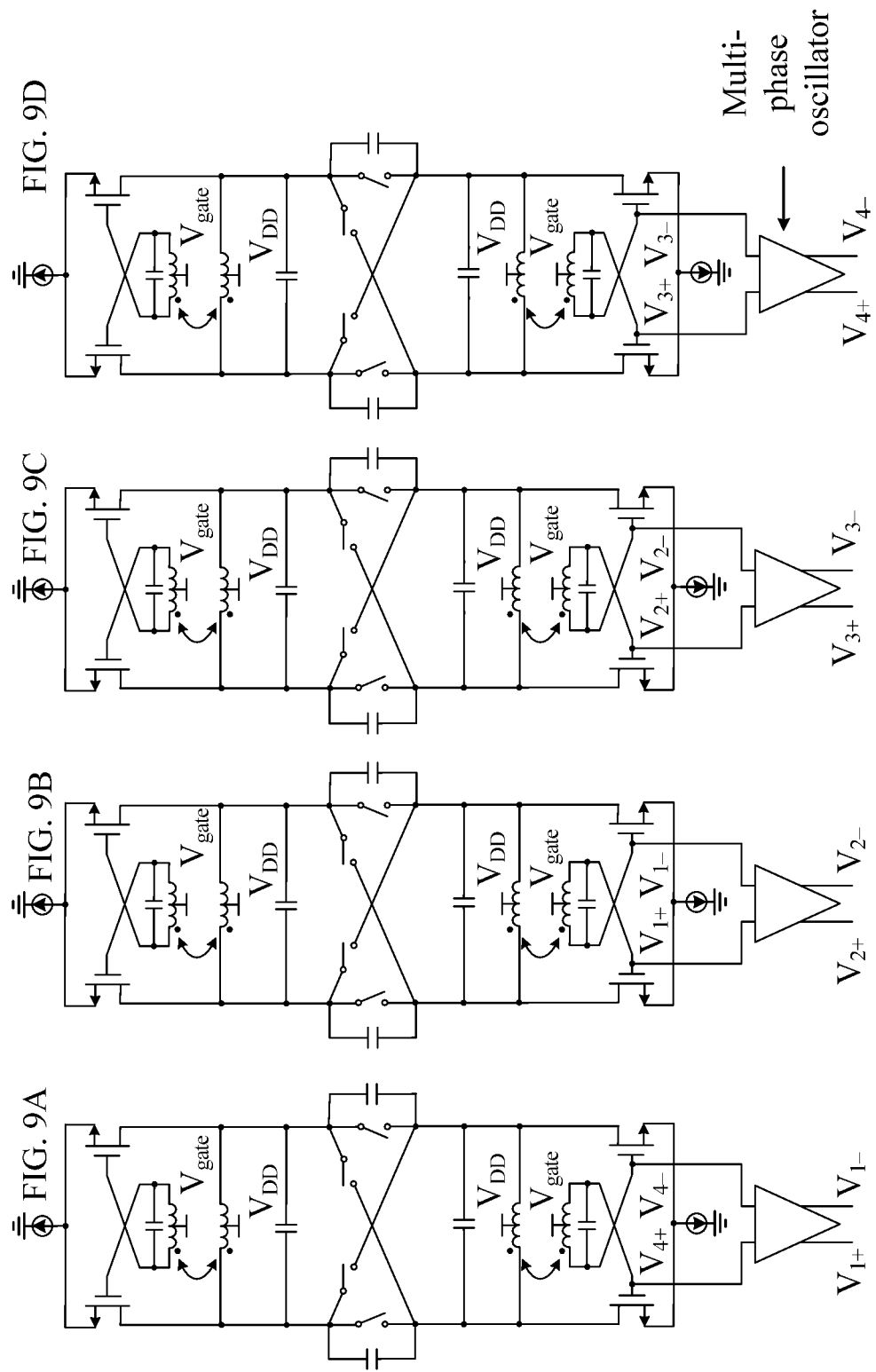

DUAL-MODE OSCILLATOR AND MULTI-PHASE OSCILLATOR

CROSS-REFERENCE TO RELATED APPLICATIONS

This application is a continuation application of U.S. patent application Ser. No. 15/714,619 filed on Sep. 25, 2017, which claims priority to Chinese Patent Application No. 201610966245.9 filed on Nov. 4, 2016. All of the afore-mentioned patent applications are hereby incorporated by reference in their entireties.

TECHNICAL FIELD

This application relates to the field of oscillator technologies, and in particular, to a dual-mode oscillator and a multi-phase oscillator that is based on the dual-mode oscillator.

BACKGROUND

An oscillator is an energy conversion apparatus that converts direct current electric energy into alternating current electric energy having a specific frequency. It is widely applied to multiple fields such as measurement, automatic control, wireless communications, and remote control. In a wireless communications system, an oscillator (for example, a carrier oscillator of a transmitter) is mainly used to generate and output multi-frequency oscillation signals. Operating bandwidth of the wireless communications system depends on a frequency range of the oscillation signals. With development of the wireless communications system, the wireless communications system needs to have larger operating bandwidth, and the oscillator used in the system needs to output oscillation signals having a frequency range as wide as possible. A dual-mode oscillator can break a frequency range limitation of a conventional oscillator (for example, an inductor-capacitor (LC) oscillator) and provide oscillation signals having a wider frequency range, and therefore is more applied to existing wireless communications systems.

As shown in FIG. 1, a dual-mode oscillator usually includes two LC oscillators and one mode switching circuit. Each LC oscillator includes a pair of transistors and an LC oscillation circuit. Two switch groups, that is, switches S1 and S2 and switches S3 and S4, in the mode switching circuit are alternately turned on such that the two LC oscillators are in two different operating modes. When S1 and S2 are turned on and S3 and S4 are turned off, the two LC oscillators are in an in-phase mode, and an oscillation signal frequency range of the dual-mode oscillator is the same as a frequency range of a single LC oscillator. When S1 and S2 are turned off and S3 and S4 are turned on, the two LC oscillators are in a reverse-phase mode, and an oscillation signal frequency range is lower than that in the in-phase state. Because the dual-mode oscillator has a high frequency range and a low frequency range respectively in the two operating modes, compared with the conventional oscillator, the dual-mode oscillator can provide an oscillation signal having a wider frequency range.

Though the existing dual-mode oscillator can provide and output oscillation signals having a wide band, phase noise performance of the existing dual-mode oscillator is relatively poor, which is one of important factors limiting performance of a communications system. Therefore, it is necessary to provide a new oscillator, to ensure good phase noise performance while providing wide-band oscillation signals for output.

SUMMARY

This application provides a dual-mode oscillator and a multi-phase oscillator to ensure good phase noise performance while providing wide-band oscillation signals for output.

According to a first aspect, an embodiment of this application provides a dual-mode oscillator, including two transformer-coupled oscillators and a mode switching circuit, where each transformer-coupled oscillator includes a differential metal oxide semiconductor (MOS) transistor pair, a primary capacitor Cp, a secondary capacitor Cs, and a step-up transformer, a source of a first MOS transistor in the differential MOS transistor pair and a source of a second MOS transistor in the differential MOS transistor pair are connected, and coupled to a constant-voltage node, a drain of the first MOS transistor is separately connected to one end of the primary capacitor Cp and a first input end of the step-up transformer, and a drain of the second MOS transistor is separately connected to the other end of the primary capacitor Cp and a second input end of the step-up transformer, a gate of the first MOS transistor is separately connected to one end of the secondary capacitor Cs and a second output end of the step-up transformer, and a gate of the second MOS transistor is separately connected to the other end of the secondary capacitor Cs and a first output end of the step-up transformer, where the first input end and the first output end are dotted terminals, and the mode switching circuit is located between the two transformer-coupled oscillators, separately connected to two drains of each transformer-coupled oscillator, and configured to change an oscillation frequency range of output of the dual-mode oscillator by means of switching.

Optionally, an output end of the dual-mode oscillator is the two drains or the two gates of any transformer-coupled oscillator.

In the dual-mode oscillator provided in this embodiment of this application, switching between two operating modes is implemented using the mode switching circuit such that oscillation signals having two different bands can be obtained, and values of a primary capacitor Cp and a secondary capacitor Cs in each transformer-coupled oscillator and capacitors $C_{mode}$ in the mode switching circuit may be tuned to output oscillation signals having a wide band. In addition, the dual-mode oscillator in this embodiment of this application includes two transformer-coupled oscillators, and a drain of a first MOS transistor in each transformer-coupled oscillator is connected to a gate of a second MOS transistor through a step-up transformer, that is, the step-up transformer multiplies a drain voltage swing of the first MOS transistor and then injects a voltage signal to the gate of the second MOS transistor such that a larger gate voltage swing is obtained without increasing a supply voltage of the oscillator, and phase noise performance of the dual-mode oscillator is improved. Moreover, in the dual-mode oscillator, the two transformer-coupled oscillators are coupled through the mode switching circuit such that the phase noise performance can be further improved.

In a possible implementation, the first MOS transistor and the second MOS transistor are both N-channel MOS (NMOS) transistors. The source of the first NMOS transistor and the source of the second NMOS transistor are connected, and coupled to the constant-voltage node, and the constant-voltage node is directly grounded, or the constant-voltage node is grounded through a tail current source.

In a possible implementation, a center tap of a primary inductor Lp of the step-up transformer is connected to a power supply voltage $V_{DD}$, and a center tap of a secondary inductor Ls of the step-up transformer is connected to a bias voltage $V_{gate}$.

In a possible implementation, the first MOS transistor and the second MOS transistor are both P-channel MOS (PMOS) transistors. The source of the first PMOS transistor and the source of the second PMOS transistor are connected, and coupled to the constant-voltage node, and the constant-voltage node is directly connected to a power supply voltage $V_{DD}$, or the constant-voltage node is connected to a power supply voltage $V_{DD}$ through a tail current source.

In a possible implementation, a center tap of a primary inductor Lp of the step-up transformer is grounded, and a center tap of a secondary inductor Ls of the step-up transformer is connected to a bias voltage $V_{gate}$.

In a possible implementation, at least one of the primary capacitor Cp or the secondary capacitor Cs includes at least one of a switch capacitor array or a variable capacitance diode, which is tunable by a tuning signal.

In this implementation, if the primary capacitor Cp and the secondary capacitor Cs each include a switch capacitor array and a variable capacitance diode, stepped tuning on capacitance of the primary capacitor Cp and the secondary capacitor Cs can be implemented by changing quantities of enabled capacitors in switch capacitor arrays, to further implement stepped tuning on an oscillation frequency of the transformer-coupled oscillator, and continuous fine tuning on the capacitance of the primary capacitor Cp and the secondary capacitor Cs can be implemented by tuning control voltages of variable capacitance diodes, to further implement continuous fine tuning on the oscillation frequency of the transformer-coupled oscillator.

In a possible implementation, the mode switching circuit includes a control circuit and at least two mode capacitors $C_{mode}$ coupled to the control circuit, and the control circuit is configured to switch the dual-mode oscillator between an odd mode and an even mode under an effect of a mode control signal, where in the odd mode, the mode capacitors $C_{mode}$ are equivalent to being bypassed, and the oscillation frequency range is a first oscillation frequency range, and in the even mode, the mode capacitors $C_{mode}$ are equivalent to bridging the two drains of each transformer-coupled oscillator, and the oscillation frequency range is a second oscillation frequency range, where the second oscillation frequency range is different from the first oscillation frequency range.

In a possible implementation, the second oscillation frequency range is lower than the first oscillation frequency range.

In a possible implementation, the control circuit includes a first odd mode switch and a second odd mode switch, and a first even mode switch and a second even mode switch, the first even mode switch and the second even mode switch are each connected in parallel to at least one of the mode capacitors, two ends of the first even mode switch are respectively connected to drains of first MOS transistors of the two transformer-coupled oscillators, and two ends of the second even mode switch are respectively connected to drains of second MOS transistors of the two transformer-coupled oscillators, and two ends of the first odd mode switch are respectively connected to a drain of a first MOS transistor of one transformer-coupled oscillator and a drain of a second MOS transistor of the other transformer-coupled oscillator, and two ends of the second odd mode switch are respectively connected to a drain of a second MOS transistor of the one transformer-coupled oscillator and a drain of a first MOS transistor of the other transformer-coupled oscillator, where in the odd mode, the first odd mode switch and the second odd mode switch are turned on, and the first even mode switch and the second even mode switch are turned off, and in the even mode, the first odd mode switch and the second odd mode switch are turned off, and the first even mode switch and the second even mode switch are turned on.

In the foregoing implementation, the two odd mode switches and the two even mode switches both can be implemented using MOS transistors operating in an on/off state, and the switches are controlled using a mode control signal to be turned on and turned off, to switch an operating mode of the dual-mode oscillator between the odd mode and the even mode. In the even mode, the mode capacitors $C_{mode}$ are bypassed by the even mode switches that are turned on, the oscillation frequency range of the dual-mode oscillator is the same as an oscillation frequency range of a single transformer-coupled oscillator. In this case, the oscillation frequency range of the single transformer-coupled oscillator can be tuned by tuning values of the primary capacitor Cp and the secondary capacitor Cs to tune an oscillation frequency range of a high-frequency oscillation signal of the dual-mode oscillator. In the odd mode, the mode capacitors $C_{mode}$ are equivalent to bridging two drain ends of the transformer-coupled oscillator such that drain capacitance of the dual-mode oscillator increases, and the oscillation frequency range is lower than the oscillation frequency range of the single transformer-coupled oscillator. In this case, an oscillation frequency range of a low-frequency oscillation signal of the dual-mode oscillator can be tuned by tuning a value of $C_{mode}$.

According to a second aspect, this application further provides a multi-phase oscillator, including N dual-mode oscillators in any implementation above and N multi-phase coupled circuits, where N is an integer greater than 1, and each multi-phase coupled circuit is coupled between two dual-mode oscillators, and a Mobius loop connection is formed by the N dual-mode oscillators and the N multi-phase coupled circuits.

Optionally, in the Mobius loop connection, N−1 multi-phase coupled circuits are directly coupled between two corresponding dual-mode oscillators, and one multi-phase coupled circuit is cross-coupled between two corresponding dual-mode oscillators.

In a possible implementation, the N dual-mode oscillators and the N multi-phase coupled circuits form N stages, each stage includes one dual-mode oscillator and one multi-phase coupled circuit, a first coupling end of a multi-phase coupled circuit at each stage is connected to drains of any transformer-coupled oscillator in a dual-mode oscillator at the stage, and a second coupling end of the multi-phase coupled circuit at each stage is connected to drains of any transformer-coupled oscillator in a dual-mode oscillator at a next stage.

In a possible implementation, the N dual-mode oscillators and the N multi-phase coupled circuits form N stages, each stage includes one dual-mode oscillator and one multi-phase coupled circuit, a first coupling end of a multi-phase coupled circuit at each stage is connected to two gates of any transformer-coupled oscillator in a dual-mode oscillator at the stage, and a second coupling end of the multi-phase coupled circuit at each stage is connected to two gates of any transformer-coupled oscillator in a dual-mode oscillator at a next stage.

In a possible implementation, the multi-phase coupled circuit includes a coupling MOS transistor pair, a source of a first coupling MOS transistor in the coupling MOS transistor pair and a source of a second coupling MOS transistor in the coupling MOS transistor pair are connected, and directly grounded or grounded through a current source, a drain of the first coupling MOS transistor and a drain of the second coupling MOS transistor are used as the first coupling end, and connected to the two drains or the two gates of any transformer-coupled oscillator in the dual-mode oscillator at the stage, and a gate of the first coupling MOS transistor and a gate of the second coupling MOS transistor are used as the second coupling end, and connected to the two drains or the two gates of any transformer-coupled oscillator in the dual-mode oscillator at the next stage.

In a possible implementation, the multi-phase coupled circuit includes a coupling capacitor pair, a coupling inductor pair, or a coupling microstrip.

In the multi-phase oscillator provided in the embodiments of this application, multiple dual-mode transformer-coupled oscillators are connected through multi-phase coupled circuits to form a Mobius loop such that oscillation signals in multiple phases can be generated, and phase noise performance of the entire oscillator can be improved. Moreover, in the multi-phase oscillator provided in the embodiments of this application, based on a same mode control signal, phases of transformer-coupled oscillator pairs in the dual-mode oscillators are synchronously locked to an in-phase or reverse-phase state using mode switching circuits such that only one transformer-coupled oscillator in each transformer-coupled oscillator pair needs to be connected to a multi-phase coupled circuit to determine phase output of an entire oscillator array. It can be learned that, the multi-phase oscillator provided in the embodiments of this application has a simple circuit structure, and a corresponding circuit layout is more easily implemented.

BRIEF DESCRIPTION OF THE DRAWINGS

To describe the technical solutions in this application more clearly, the following briefly describes the accompanying drawings describing some of the embodiments. A person of ordinary skill in the art may still derive other drawings from these accompanying drawings without creative efforts.

FIG. 4A is a diagram of a circuit of the dual-mode oscillator shown in FIG. 2 in an odd mode;

FIG. 4B is a diagram of a circuit of the dual-mode oscillator shown in FIG. 2 in an odd mode;

FIG. 8A is a diagram of a circuit structure of a coupling capacitor pair-based multi-phase oscillator according to an embodiment of this application;

FIG. 8B is a diagram of a circuit structure of a coupling capacitor pair-based multi-phase oscillator according to an embodiment of this application;

FIG. 8C is a diagram of a circuit structure of a coupling capacitor pair-based multi-phase oscillator according to an embodiment of this application;

FIG. 8D is a diagram of a circuit structure of a coupling capacitor pair-based multi-phase oscillator according to an embodiment of this application;

FIG. 9A is a diagram of a circuit structure of a multi-phase oscillator in a gate connection manner according to an embodiment of this application;

FIG. 9B is a diagram of a circuit structure of a multi-phase oscillator in a gate connection manner according to an embodiment of this application;

FIG. 9C is a diagram of a circuit structure of a multi-phase oscillator in a gate connection manner according to an embodiment of this application;

FIG. 9D is a diagram of a circuit structure of a multi-phase oscillator in a gate connection manner according to an embodiment of this application.

DETAILED DESCRIPTION OF THE EMBODIMENTS

The following clearly describes the technical solutions in the embodiments of the present disclosure with reference to the accompanying drawings in the embodiments of the present disclosure. The described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Figure 2:
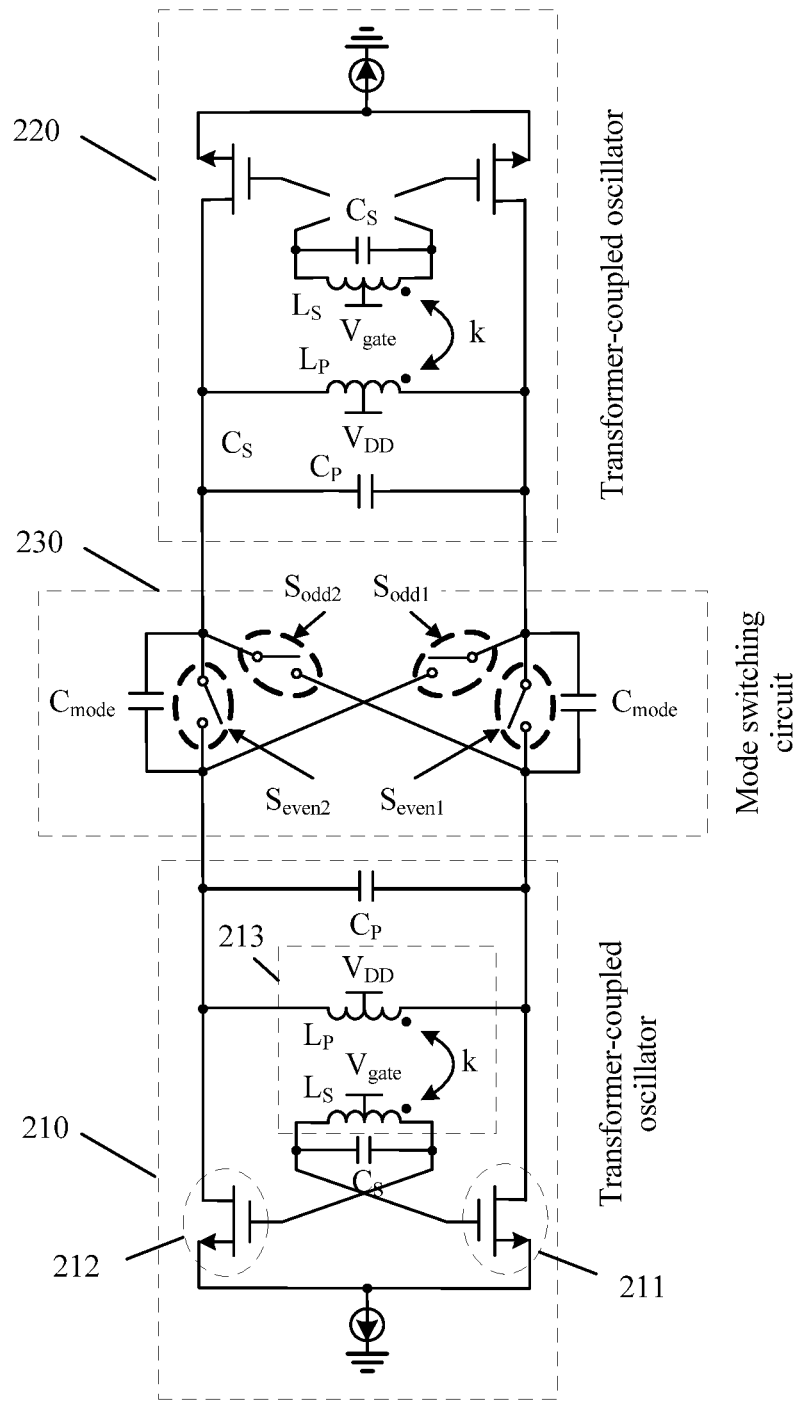
FIG. 2 is a diagram of a circuit structure of a dual-mode oscillator according to an embodiment of this application.

FIG. 2 is a diagram of a circuit structure of a dual-mode oscillator according to an embodiment of this application. The dual-mode oscillator may be applied to multiple fields including a wireless communications system.

As shown in FIG. 2, the dual-mode oscillator provided in this embodiment of this application is designed based on a transformer-coupled oscillator, and may include two transformer-coupled oscillators 210 and 220 and a mode switching circuit 230. The transformer-coupled oscillator 210 and the transformer-coupled oscillator 220 are connected through the mode switching circuit 230.

A circuit structure of the transformer-coupled oscillator is first described. In this embodiment of this application, the transformer-coupled oscillator 210 and the transformer-coupled oscillator 220 have a same circuit structure, and each include a differential MOS transistor pair, a primary capacitor Cp, a secondary capacitor Cs, and a step-up transformer. The following describes a specific circuit structure of the transformer-coupled oscillator using the transformer-coupled oscillator 210 as an example.

As shown in FIG. 2, the transformer-coupled oscillator 210 includes a differential MOS transistor pair, a primary capacitor Cp, a secondary capacitor Cs, and a step-up transformer 213.

The differential MOS transistor pair includes a first MOS transistor 211 and a second MOS transistor 212. A source of the first MOS transistor 211 and a source of the second MOS transistor 212 are connected. A drain of the first MOS transistor 211 is separately connected to one end of the primary capacitor Cp and a first input end of the step-up transformer 213, and a drain of the second MOS transistor 212 is separately connected to the other end of the primary capacitor Cp and a second input end of the step-up transformer 213. A gate of the first MOS transistor 211 is separately connected to one end of the secondary capacitor Cs and a second output end of the step-up transformer 213, and a gate of the second MOS transistor 212 is separately connected to the other end of the secondary capacitor Cs and a first output end of the step-up transformer 213. If the first MOS transistor 211 and the second MOS transistor 212 are NMOS transistors, the source of the first MOS transistor 211 and the source of the second MOS transistor 212 are grounded through a current source or are directly grounded, as shown in FIG. 2. If the first MOS transistor 211 and the second MOS transistor 212 are PMOS transistors, the source of the first MOS transistor 211 and the source of the second MOS transistor 212 are connected to a constant-voltage directly or through a current source. The following provides a specific description with reference to FIG. 2.

For FIG. 2, further, the step-up transformer 213 includes a primary inductor Lp and a secondary inductor Ls, which are respectively connected to a power supply voltage $V_{DD}$ and a bias voltage $V_{gate}$. A dotted terminal of the primary inductor Lp is the first input end of the step-up transformer 213, a non-dotted terminal of the primary inductor Lp is the second input end of the step-up transformer 213. Correspondingly, a dotted terminal of the secondary inductor Ls is the first output end of the step-up transformer 213, and a non-dotted terminal of the secondary inductor Ls is the second output end of the step-up transformer 213. That is, the first input end and the first output end of the step-up transformer 213 are dotted terminals, and the drains and the gates of the differential MOS transistor pair have a reverse-phase relationship with the input end and the output end of the step-up transformer 213. Step-up times of the step-up transformer 213 are k (k>1), that is, a voltage at an output end (equivalent to a voltage at two ends of the secondary capacitor Cs) is k times of a voltage at an input end (equivalent to a voltage at two ends of the primary capacitor Cp). A step-up function is implemented by means of coupling from the primary inductor Lp to the secondary inductor Ls.

The two drains of the differential MOS transistor pair in the transformer-coupled oscillator are used as an output end of the transformer-coupled oscillator, and a signal that is output by the output end is an oscillation signal generated by the transformer-coupled oscillator. An oscillation frequency of the oscillation signal can be tuned by tuning values of the primary capacitor Cp and the secondary capacitor Cs. Therefore, the primary capacitor Cp and the secondary capacitor Cs may be tunable capacitors, or capacitance of at least one of the two capacitors may be tuned using a control signal.

It should be noted that, in the transformer-coupled oscillator, a drain of one MOS transistor is connected to a gate of the other MOS transistor through a transformer. Therefore, in another implementation, the two gates of the transformer-coupled oscillator may be used as the output end of the transformer-coupled oscillator. Correspondingly, in the dual-mode oscillator obtained by coupling the two transformer-coupled oscillators with the mode switching circuit, two gates of any of the transformer-coupled oscillators may be used as an output end of the dual-mode oscillator.

As shown in FIG. 2, the mode switching circuit 230 is located between the two transformer-coupled oscillators 210 and 220, and separately connected to drain output ends of the two transformer-coupled oscillators to couple the two transformer-coupled oscillators 210 and 220 into the dual-mode oscillator. The output end of the dual-mode oscillator may be an output end of the transformer-coupled oscillator 210, or may be an output end of the transformer-coupled oscillator 220.

The mode switching circuit 230 includes a control circuit and two mode capacitors $C_{mode}$ coupled to the control circuit. The control circuit includes a pair of odd mode switches $S_{odd1}$ and $S_{odd2}$ and a pair of even mode switches $S_{even1}$ and $S_{even2}$. The two even mode switches $S_{even1}$ and $S_{even2}$ are each connected in parallel to one mode capacitor $C_{mode}$.

Two ends of the first even mode switch $S_{even1}$ are respectively connected to the drain of the first MOS transistor 211 in the transformer-coupled oscillator 210 and a drain of a first MOS transistor in the transformer-coupled oscillator 220. Two ends of the second even mode switch $S_{even2}$ are respectively connected to the drain of the second MOS transistor 212 in the transformer-coupled oscillator 210 and a drain of a second MOS transistor in the transformer-coupled oscillator 220.

Two ends of the first odd mode switch $S_{odd1}$ are respectively connected to the drain of the second MOS transistor 212 in the transformer-coupled oscillator 210 and the drain of the first MOS transistor in the transformer-coupled oscillator 220. Two ends of the second odd mode switch $S_{odd2}$ are respectively connected to the drain of the first MOS transistor 211 in the transformer-coupled oscillator 210 and the drain of the second MOS transistor in the transformer-coupled oscillator 220.

The two odd mode switches $S_{odd1}$ and $S_{odd2}$ and the two even mode switches $S_{even1}$ and $S_{even2}$ both may be implemented using MOS transistors operating in an on/off state, and the switches are controlled using a mode control signal to be turned on and turned off.

In this embodiment of this application, the two pairs of switches in the mode switching circuit 230 are alternately turned on, to switch an operating mode of the dual-mode oscillator between an odd mode and an even mode, and further to change an oscillation frequency range of an oscillation signal that is output by the dual-mode oscillator. A specific operating situation is as follows.

Figure 3A:
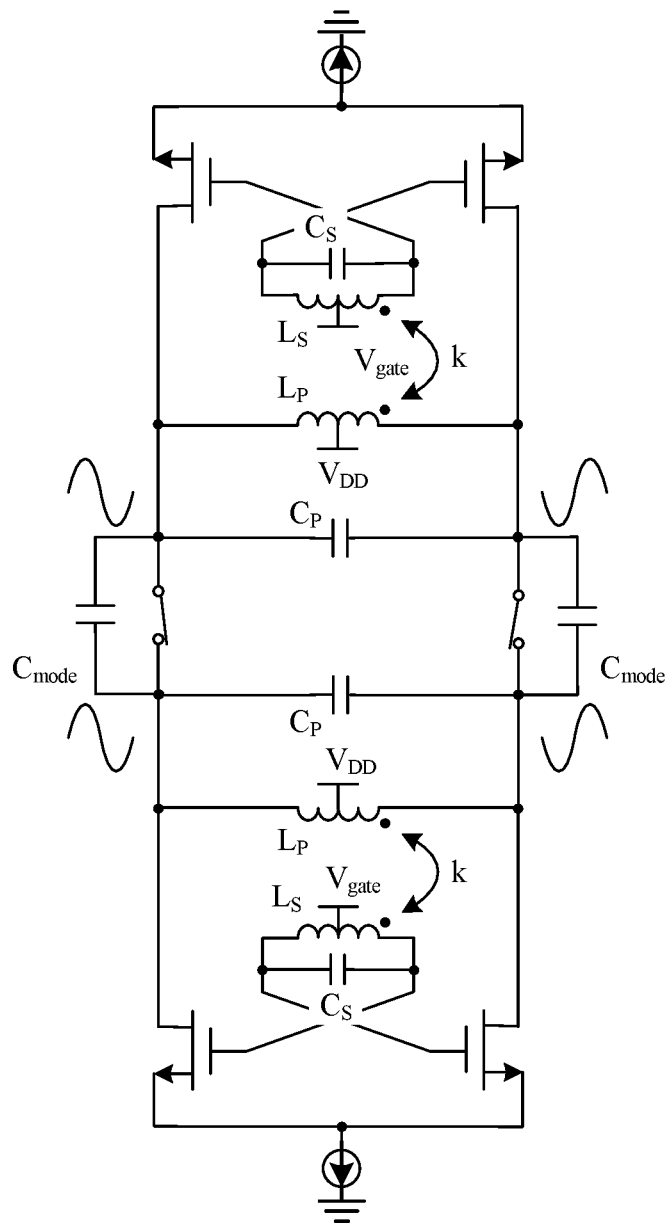
FIG. 3A is a diagram of a circuit of the dual-mode oscillator shown in FIG. 2 in an even mode.
Figure 3B:
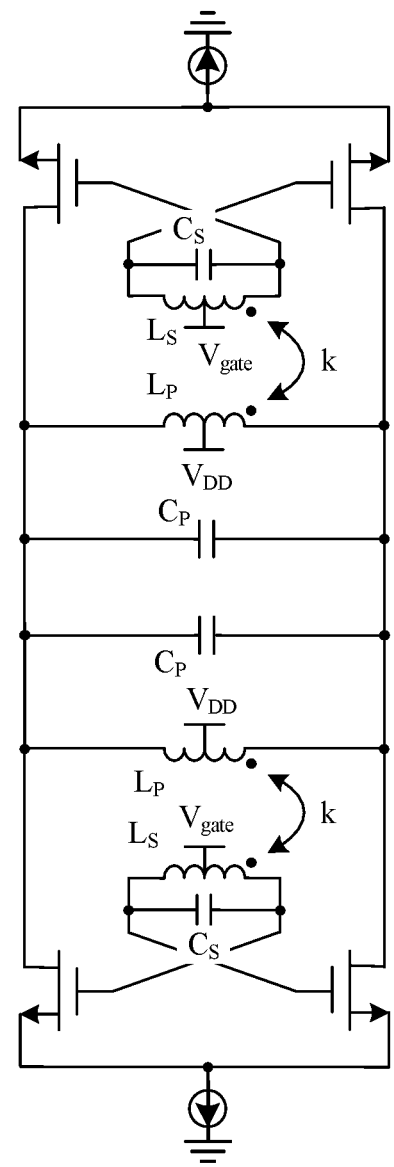
FIG. 3B is a diagram of a circuit of the dual-mode oscillator shown in FIG. 2 in an even mode.

(1) When $S_{even1}$ and $S_{even2}$ are turned on and $S_{odd1}$ and $S_{odd2}$ are turned off, the circuit operates in the even mode, and a circuit of the dual-mode oscillator is shown in FIG. 3A. In this case, the drain output ends of the two transformer-coupled oscillators are directly connected by the mode capacitors $C_{mode}$ and the two even mode switches that are turned on, and the two oscillators operate in an in-phase state, that is, two ends of the mode capacitor $C_{mode}$ have a same waveform, no current passes through the mode capacitor $C_{mode}$, and $C_{mode}$ may be removed equivalently, that is, $C_{mode}$ is equivalent to being bypassed. An equivalent circuit is shown in FIG. 3B. The oscillation frequency range of the dual-mode oscillator is the same as an oscillation frequency range of a single transformer-coupled oscillator.

(2) When $S_{odd1}$ and $S_{odd2}$ are turned on and $S_{even1}$ and $S_{even2}$ are turned off, the circuit operates in the odd mode, and a circuit of the dual-mode oscillator is shown in FIG. 4A. In this case, the drain output ends of the two transformer-coupled oscillators are cross-connected by the two odd mode switches that are turned on, and are also connected to the mode capacitors $C_{mode}$, and the two transformer-coupled oscillators operate in a reverse-phase state, that is, waveforms at the two ends of the mode capacitor $C_{mode}$ are differential output voltages of the two transformer-coupled oscillators. In this case, the mode capacitor $C_{mode}$ may be equivalent to bridging two drain ends of the transformer-coupled oscillators, and an equivalent circuit is shown in FIG. 4B. In this case, drain capacitance of the entire dual-mode oscillator increases, and the oscillation frequency range is lower than the oscillation frequency range of the single transformer-coupled oscillator.

It can be learned that, compared with a conventional single oscillator, in the dual-mode oscillator provided in this embodiment of this application, switching between the two operating modes is implemented using the mode switching circuit such that oscillation signals having two different bands can be obtained, and the oscillation frequency range is widened. Moreover, the mode switching circuit couples the two transformer-coupled oscillators such that phase noise performance can be further improved. An oscillation frequency range of a high-frequency oscillation signal obtained in the even mode is the same as the oscillation frequency range of the single transformer-coupled oscillator such that the oscillation frequency range of the single transformer-coupled oscillator can be tuned by tuning values of the primary capacitor Cp and the secondary capacitor Cs to tune the oscillation frequency range of the high-frequency oscillation signal of the dual-mode oscillator. Moreover, an oscillation frequency range of a low-frequency oscillation signal obtained in the odd mode is related to the mode capacitors $C_{mode}$ such that the oscillation frequency range of the low-frequency oscillation signal of the dual-mode oscillator can be tuned by tuning a value of $C_{mode}$. Therefore, in the dual-mode oscillator provided in this embodiment of this application, values of the primary capacitor Cp and the secondary capacitor Cs in each transformer-coupled oscillator and the mode capacitors $C_{mode}$ in the mode switching circuit may be tuned to output oscillation signals having a wide band.

Figure 1:
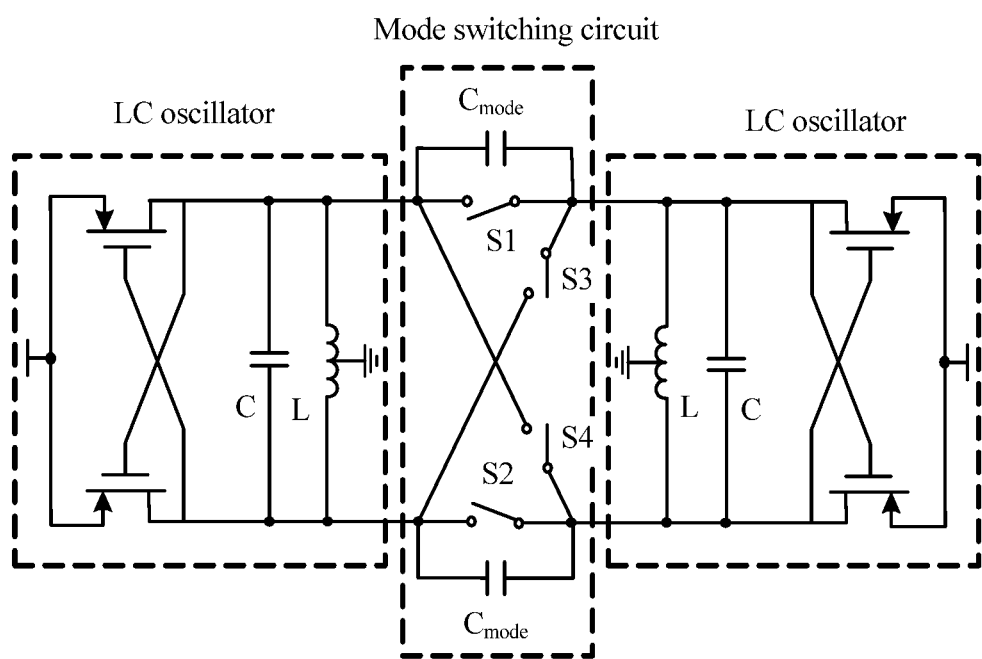
FIG. 1 is a diagram of a circuit structure of a dual-mode oscillator.

A main cause for poor phase noise performance of an existing LC oscillator-based dual-mode oscillator is that a drain voltage of one MOS transistor of each LC oscillator is directly injected to a gate of the other MOS transistor (as shown in FIG. 1), leading to a relatively small gate voltage. In this embodiment of this application, the dual-mode oscillator includes the two transformer-coupled oscillators, the drain of the first MOS transistor in each transformer-coupled oscillator is connected to the gate of the second MOS transistor through the step-up transformer, that is, the step-up transformer multiplies a drain voltage swing of the first MOS transistor and then injects a voltage signal to the gate of the second MOS transistor such that a larger gate voltage swing is obtained without increasing a supply voltage of the oscillator, and the phase noise performance of the dual-mode oscillator is improved.

In a feasible embodiment of the present disclosure, the differential MOS transistor pair in the transformer-coupled oscillator may be an NMOS transistor pair. As shown in FIG. 2, the first MOS transistor 211 and the second MOS transistor 212 are both NMOS transistors. In this case, after being connected, the source of the first NMOS transistor and the source of the second NMOS transistor may be grounded through a tail current source (as shown in FIG. 2). Alternatively, the tail current source in FIG. 2 may be removed, and the source of the first NMOS transistor and the source of the second NMOS transistor are directly grounded. In addition, when the differential MOS transistor pair is an NMOS transistor pair, a center tap of the primary inductor Lp of the step-up transformer 213 is connected to the power supply voltage $V_{DD}$, and a center tap of the secondary inductor Ls of the step-up transformer is connected to the gate bias voltage $V_{gate}$ of an NMOS transistor (the first NMOS transistor or the second NMOS transistor).

In a feasible embodiment of the present disclosure, the differential MOS transistor pair in the transformer-coupled oscillator may alternatively be a PMOS transistor pair. For example, in a transformer-coupled oscillator 510 shown in FIG. 5, a source of a first PMOS transistor 511 and a source of a second PMOS transistor 512 are both connected to a power supply voltage $V_{DD}$ through a current source (or directly connected to the power supply voltage $V_{DD}$). In addition, a center tap of a primary inductor Lp of a step-up transformer 513 of the transformer-coupled oscillator 510 is grounded, and a center tap of a secondary inductor Ls is connected to a gate bias voltage $V_{gate}$ of a PMOS transistor (the first PMOS transistor or the second PMOS transistor). Connection manners of the other wiring ends of the transformer-coupled oscillator 510 are the same as those of the transformer-coupled oscillator 210, and details are not described herein again.

Figure 5:
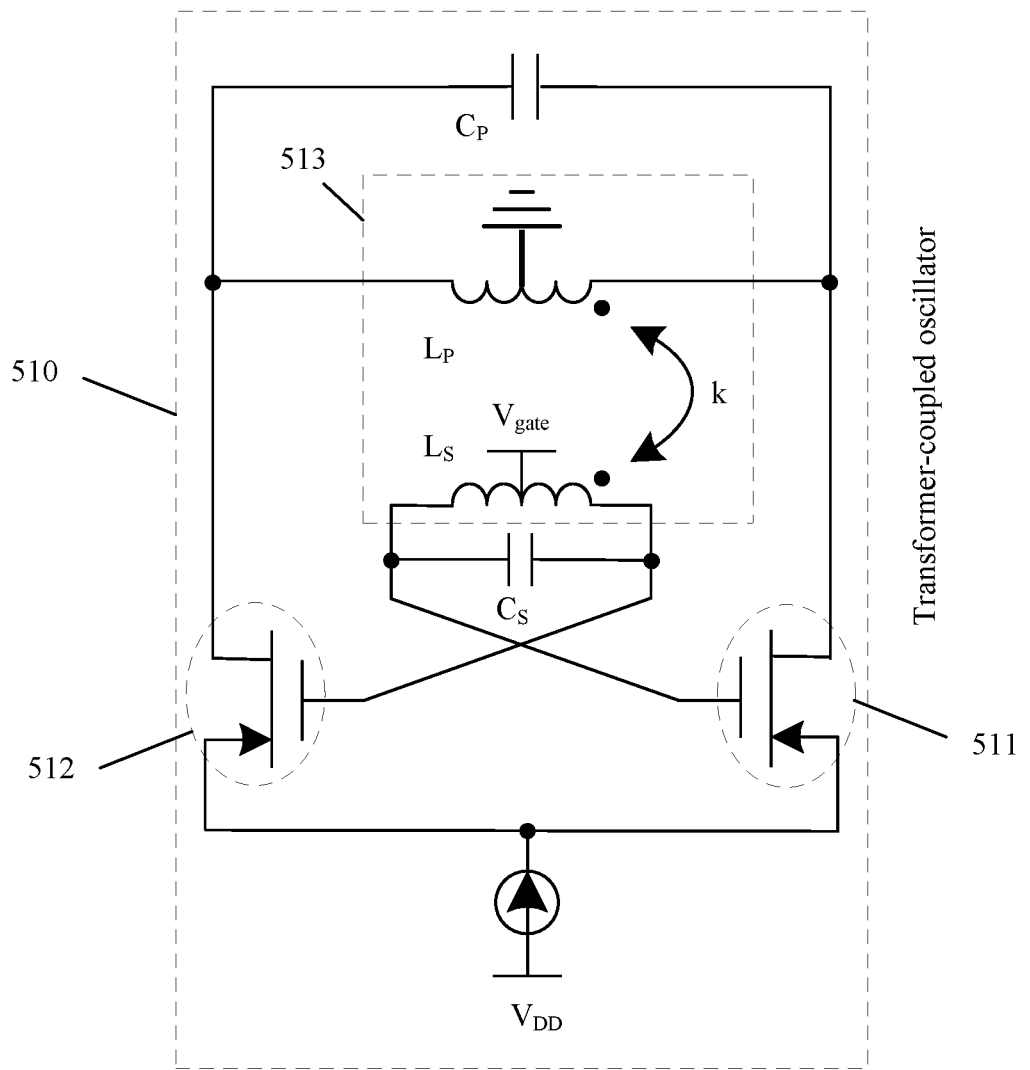
FIG. 5 is a diagram of a circuit structure of a transformer-coupled oscillator in a dual-mode oscillator according to an embodiment of this application.

In this embodiment of this application, the two transformer-coupled oscillators in the dual-mode oscillator shown in FIG. 2 may be both replaced with the transformer-coupled oscillator 510 shown in FIG. 5 to obtain a dual-mode oscillator in another structure. An operation principle of the dual-mode oscillator is the same as the principle described above.

In a feasible embodiment of the present disclosure, each of the primary capacitor Cp and the secondary capacitor Cs in the transformer-coupled oscillator may be implemented using at least one of a switch capacitor array or a variable capacitance diode, to obtain a tunable capacitor, that is, the primary capacitor Cp includes at least one of a first switch capacitor array or a first variable capacitance diode, and the secondary capacitor Cs includes at least one of a second switch capacitor array or a second variable capacitance diode. In this embodiment, if the primary capacitor Cp and the secondary capacitor Cs each include the switch capacitor array and the variable capacitance diode, stepped tuning on capacitance of the primary capacitor Cp and the secondary capacitor Cs can be implemented by changing quantities of enabled capacitors in the switch capacitor arrays, to further implement stepped tuning on an oscillation frequency of the transformer-coupled oscillator, and continuous fine tuning on the capacitance of the primary capacitor Cp and the secondary capacitor Cs can be implemented by tuning control voltages of the variable capacitance diodes to further implement continuous fine tuning on the oscillation frequency of the transformer-coupled oscillator.

Based on the dual-mode oscillator in the foregoing embodiment, an embodiment of this application further provides a multi-phase oscillator. The multi-phase oscillator includes N dual-mode oscillators provided in any embodiment above and N multi-phase coupled circuits. N is an integer greater than 1. Any multi-phase coupled circuit is coupled between two dual-mode oscillators, and is configured to couple a coupling point of one of the dual-mode oscillators to a coupling point of the other dual-mode oscillator. A coupling point of any dual-mode oscillator may be an output of the dual-mode oscillator, that is, two drains of any transformer-coupled oscillator in the dual-mode oscillator, or two gates of any transformer-coupled oscillator in the dual-mode oscillator. A Mobius loop connection is formed by the N dual-mode oscillators and the N multi-phase coupled circuits. Multiple stages are formed, and each stage includes one dual-mode oscillator and one multi-phase coupled circuit. That is, a first coupling end of a multi-phase coupled circuit at each stage is connected to a dual-mode oscillator at the stage. Second coupling ends of multi-phase coupled circuits at N−1 of the N stages are each directly connected (in-phase connection) to a dual-mode oscillator at a next stage, that is, directly coupled, and a second coupling end of a multi-phase coupled circuit at the other stage is crossed and then connected (reverse-phase connection) to a dual-mode oscillator at a next stage, that is, cross-coupled. In the multi-phase oscillator provided in this embodiment of this application, a value of N may be an integer such as 2 or 3 or 4. The following describes a circuit structure of the multi-phase oscillator with reference to accompanying drawings using an example in which N=4.

Figure 6:
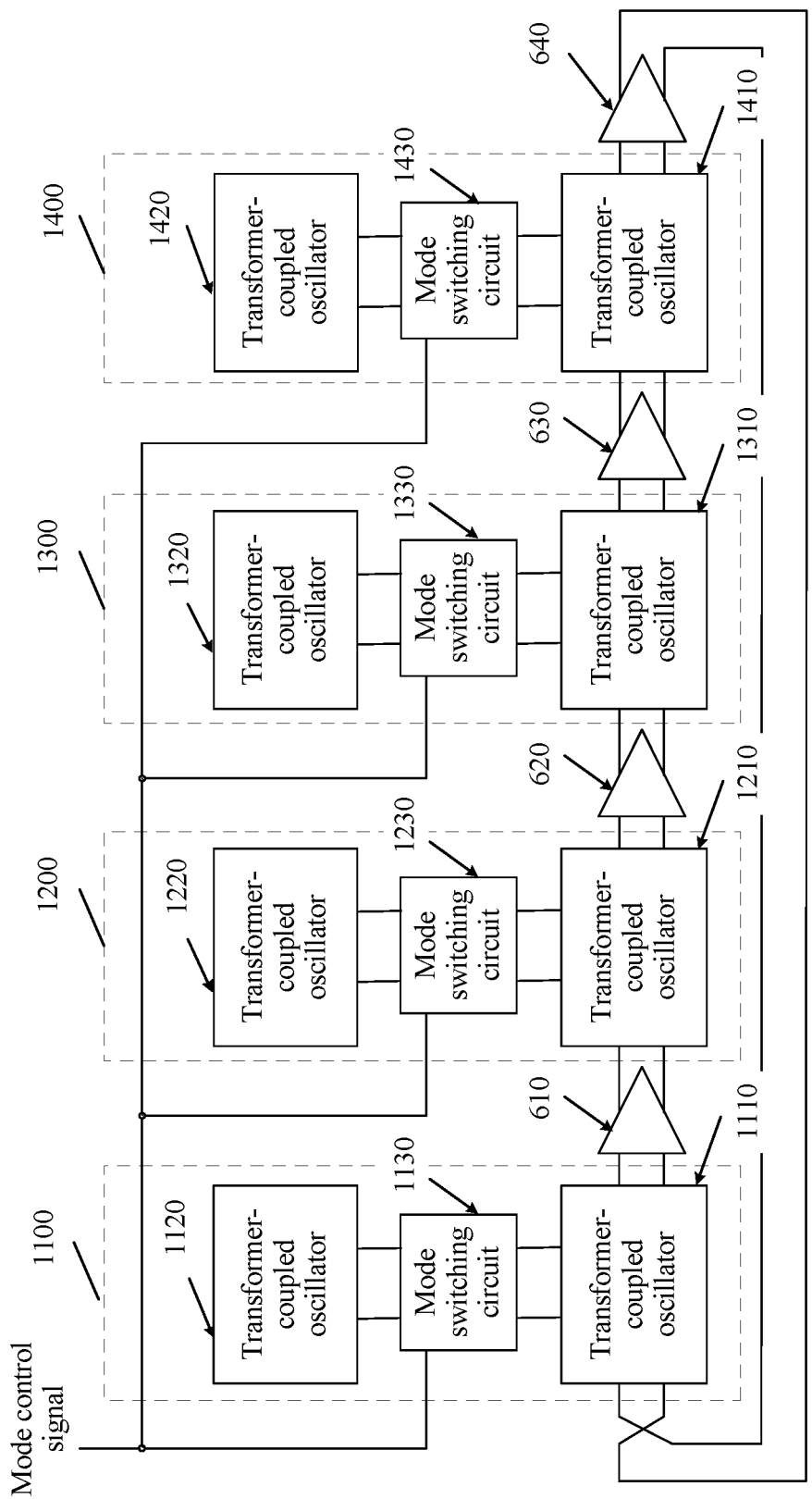
FIG. 6 is a diagram of a circuit module of a multi-phase oscillator according to an embodiment of this application.

In a diagram of a module of a multi-phase oscillator shown in FIG. 6, a Mobius loop connection is formed by four dual-mode oscillators respectively numbered 1100, 1200, 1300, and 1400 and four multi-phase coupled circuits 610, 620, 630, and 640, a four-stage dual-mode oscillator system is formed, and each stage includes one dual-mode oscillator and one multi-phase coupled circuit. A dual-mode oscillator at each stage includes two transformer-coupled oscillators and a mode switching circuit connecting the two transformer-coupled oscillators. Mode switching circuits in the dual-mode oscillators at the stages are respectively numbered 1130, 1230, 1330, and 1430, and perform synchronous switching control using a same mode control signal.

In this embodiment, a first coupling end of a multi-phase coupled circuit at each stage is connected to a coupling point of a dual-mode oscillator at the stage, and a second coupling end of the multi-phase coupled circuit at each stage is connected to a coupling point of a dual-mode oscillator at a next stage. Further, as shown in FIG. 6, a first coupling end of the multi-phase coupled circuit 610 at the first stage is connected to a coupling point of the dual-mode oscillator 1100 at the first stage, and a second coupling end of the multi-phase coupled circuit 610 at the first stage is connected to a coupling point of the dual-mode oscillator 1200 at the second stage. A first coupling end of the multi-phase coupled circuit 620 at the second stage is connected to a coupling point of the dual-mode oscillator 1200 at the second stage, and a second coupling end of the multi-phase coupled circuit 620 at the second stage is connected to a coupling point of the dual-mode oscillator 1300 at the third stage. A first coupling end of the multi-phase coupled circuit 630 at the third stage is connected to a coupling point of the dual-mode oscillator 1300 at the third stage, and a second coupling end of the multi-phase coupled circuit 630 at the third stage is connected to a coupling point of the dual-mode oscillator 1400 at the fourth stage. A first coupling end of the multi-phase coupled circuit 640 at the fourth stage is connected to a coupling point of the dual-mode oscillator 1400 at the fourth stage, and a second coupling end of the multi-phase coupled circuit 640 at the fourth stage is crossed and then connected to a coupling point of the dual-mode oscillator 1100 at the first stage.

The coupling point of the dual-mode oscillator may be two gates or two drains of any transformer-coupled oscillator in the dual-mode oscillator. That is, in a case with the four stages shown in FIG. 6, there may be $2^4$ connection manners when different transformer-coupled oscillators are selected, including connections between four transformer-coupled oscillators respectively numbered 1110, 1210, 1310, and 1410 shown in FIG. 6 and the multi-phase coupled circuits, and also including connections between four transformer-coupled oscillators respectively numbered 1120, 1220, 1320, and 1420 and the multi-phase coupled circuits, and the like.

In the diagram of the module shown in FIG. 6, two output ends of each of the multi-phase coupled circuit 610 at the first stage, the multi-phase coupled circuit 620 at the second stage, and the multi-phase coupled circuit 630 at the third stage are directly connected to a corresponding dual-mode oscillator at a next stage, and only two output ends of the multi-phase coupled circuit 640 at the fourth stage are crossed and then connected to a dual-mode oscillator at a next stage, that is, connected to the transformer-coupled oscillator 1110, to form the Mobius loop connection. It should be noted herein that, in another embodiment, the Mobius loop connection may alternatively be formed by setting two output ends of the multi-phase coupled circuit 610 at the first stage (or the multi-phase coupled circuit 620 at the second stage or the multi-phase coupled circuit 630 at the third stage) to be cross-connected, and setting output ends of the other three multi-phase coupled circuits to be directly connected.

Compared with the dual-mode oscillator shown in FIG. 1 that can generate differential signals in only two phases, in the multi-phase oscillator provided in this embodiment of this application, a Mobius loop is formed by multiple dual-mode transformer-coupled oscillators and multi-phase coupled circuits such that oscillation signals in multiple phases can be generated (N pairs of transformer-coupled oscillators can generate oscillation signals in 2N phases), and phase noise performance of the entire oscillator can be improved.

Moreover, in the multi-phase oscillator provided in this embodiment of this application, based on a same mode control signal, phases of transformer-coupled oscillator pairs in the dual-mode oscillators are synchronously locked to an in-phase or reverse-phase state using mode switching circuits such that only one transformer-coupled oscillator in each transformer-coupled oscillator pair needs to be connected to a multi-phase coupled circuit, to determine phase output of an entire oscillator array. It can be learned that, the multi-phase oscillator provided in this embodiment of this application has a simple circuit structure, and a corresponding circuit layout is more easily implemented.

In a feasible embodiment of this application, the multi-phase coupled circuits in the multi-phase oscillator may be implemented using coupling MOS transistor pairs. Correspondingly, the module diagram shown in FIG. 6 may be a circuit structure shown in FIG. 7A and FIG. 7B.

In this embodiment, the first coupling end of the multi-phase coupled circuit at each stage is connected to the coupling point of the dual-mode oscillator at the stage, and the second coupling end of the multi-phase coupled circuit at each stage is connected to the coupling point of the dual-mode oscillator at the next stage. Further, as shown in FIG. 6, the first coupling end of the multi-phase coupled circuit 610 at the first stage is connected to two drains of the transformer-coupled oscillator 1110 in the dual-mode oscillator 1100 at the first stage, and the second coupling end of the multi-phase coupled circuit 610 at the first stage is connected to two drains of the transformer-coupled oscillator 1210 in the dual-mode oscillator 1200 at the second stage. The first coupling end of the multi-phase coupled circuit 620 at the second stage is connected to two drains of the transformer-coupled oscillator 1210 in the dual-mode oscillator 1200 of at the second stage, and the second coupling end of the multi-phase coupled circuit 620 at the second stage is connected to two drains of the transformer-coupled oscillator 1310 in the dual-mode oscillator 1300 at the third stage. The first coupling end of the multi-phase coupled circuit 630 at the third stage is connected to two drains of the transformer-coupled oscillator 1310 in the dual-mode oscillator 1300 at the third stage, and the second coupling end of the multi-phase coupled circuit 630 at the third stage is connected to two drains of the transformer-coupled oscillator 1410 in the dual-mode oscillator 1400 at the fourth stage. The first coupling end of the multi-phase coupled circuit 640 at the fourth stage is connected to two drains of the transformer-coupled oscillator 1410 in the dual-mode oscillator 1400 at the fourth stage, and the second coupling end of the multi-phase coupled circuit 640 at the fourth stage is crossed and then connected to two drains of the transformer-coupled oscillator 1110 in the dual-mode oscillator 1100 at the first stage.

Figure 7A:
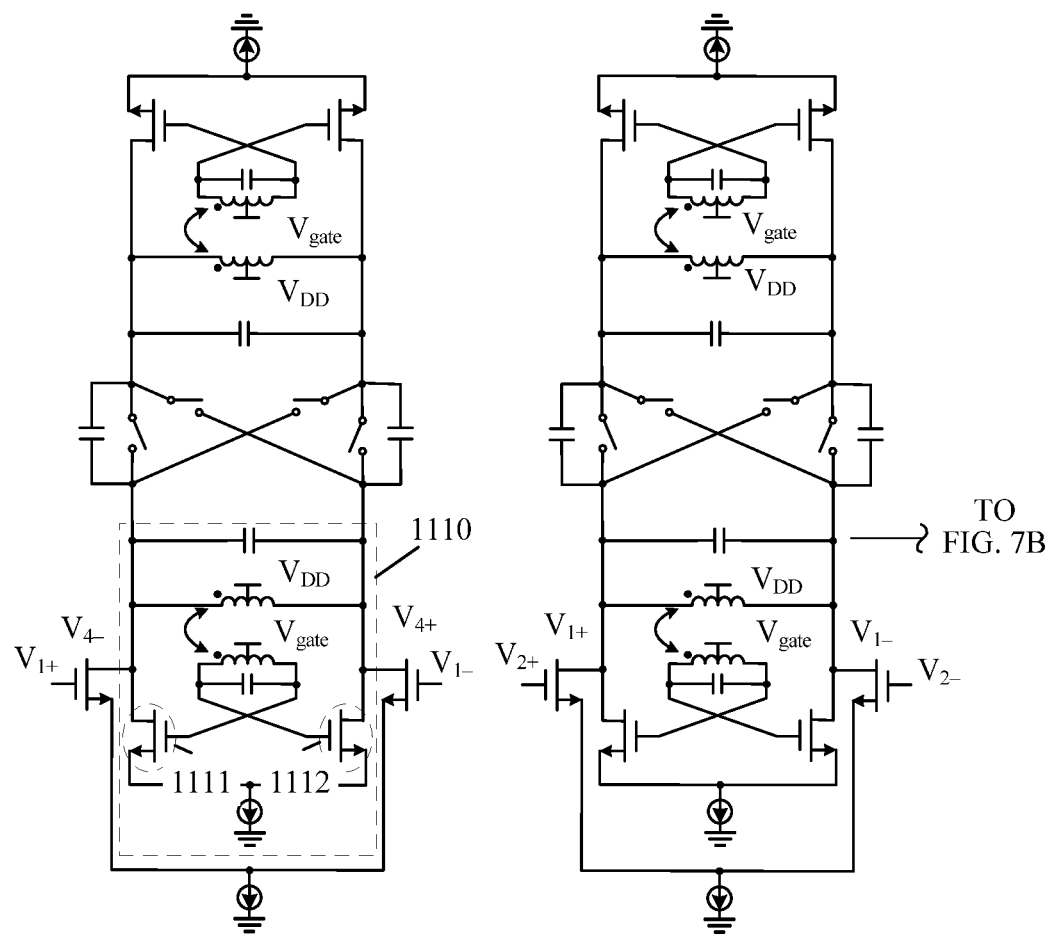
FIG. 7A is a diagram of a circuit structure of a coupling MOS transistor pair-based multi-phase oscillator according to an embodiment of this application.
Figure 7B:
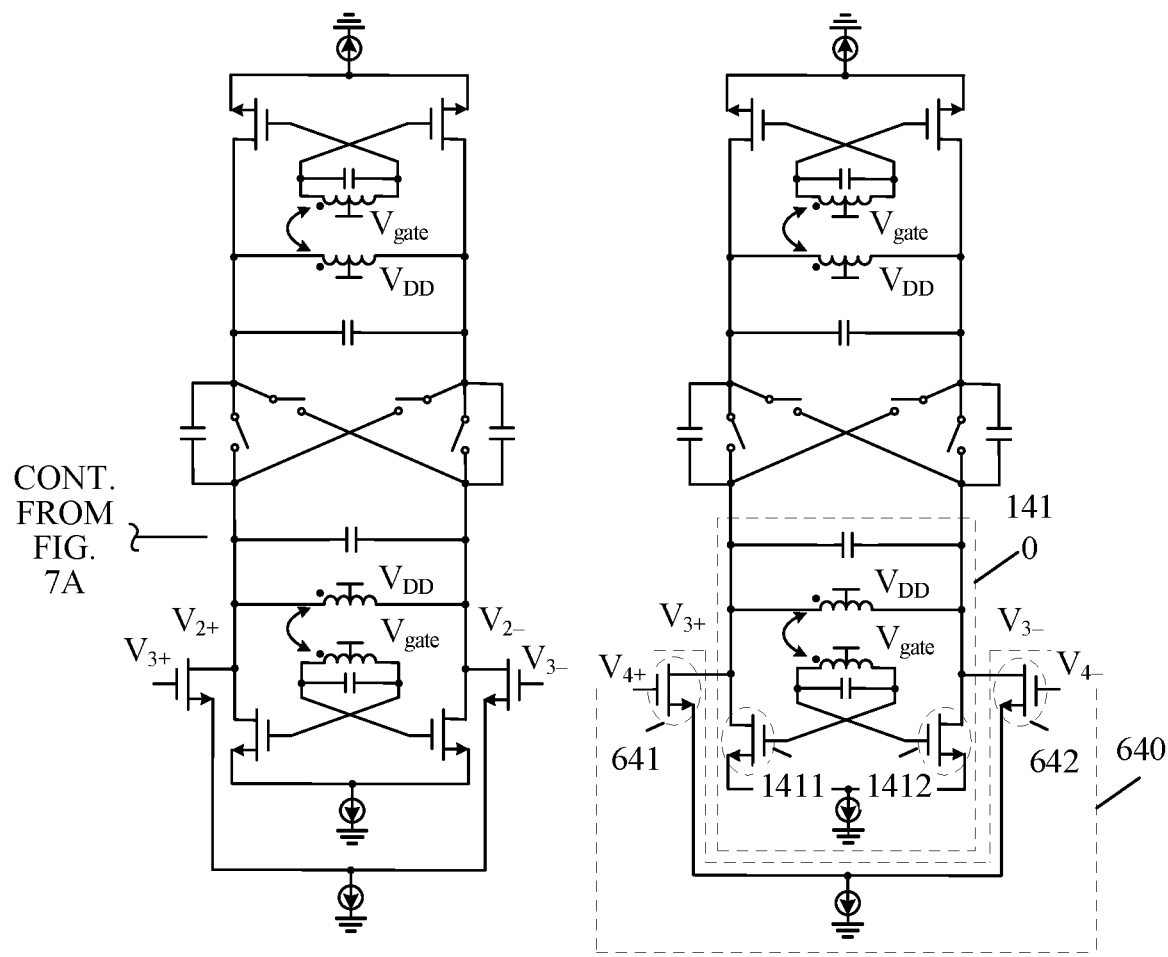
FIG. 7B is a diagram of a circuit structure of a coupling MOS transistor pair-based multi-phase oscillator according to an embodiment of this application.

Referring to FIG. 7A and FIG. 7B, the multi-phase coupled circuit at each stage includes a coupling MOS transistor pair, two drains of the coupling MOS transistor pair are used as the first coupling end of the multi-phase coupled circuit, and two gates of the coupling MOS transistor pair are used as the second coupling end of the multi-phase coupled circuit. Using the multi-phase coupled circuit 640 at the fourth stage as an example, the multi-phase coupled circuit 640 includes a first coupling MOS transistor 641 and a second coupling MOS transistor 642. A source of the first coupling MOS transistor 641 and a source of the second coupling MOS transistor 642 are both grounded (directly or through a current source). A drain of the first coupling MOS transistor 641 is connected to a drain of a first MOS transistor 1411 in the transformer-coupled oscillator 1410 (a corresponding voltage sign is $V_{3+}$), and a drain of the second coupling MOS transistor 642 is connected to a drain of a second MOS transistor 1412 in the transformer-coupled oscillator 1410 (a corresponding voltage sign is $V_{3-}$). A gate of the first coupling MOS transistor 641 and a gate of the second coupling MOS transistor 642 are respectively connected to drains of two MOS transistors in the transformer-coupled oscillator 1110. Because the second coupling end of the multi-phase coupled circuit 640 at the fourth stage is set to be cross-connected, the gate of the first coupling MOS transistor 641 is connected to a drain of a second MOS transistor 1112 in the transformer-coupled oscillator 1110 (a corresponding voltage sign is $V_{4+}$), and the gate of the second coupling MOS transistor 642 is connected to a drain of a first MOS transistor 1111 in the transformer-coupled oscillator 1110 (a corresponding voltage sign is $V_{4-}$.

In another embodiment, the second coupling end of the multi-phase coupled circuit 640 at the fourth stage may alternatively be set to be directly connected, and a second coupling end of a multi-phase coupled circuit at another stage is set to be cross-connected. In this case, in the multi-phase coupled circuit 640 at the fourth stage, the gate of the first coupling MOS transistor 641 is connected to the drain of the first MOS transistor 1111 in the transformer-coupled oscillator 1110, and the gate of the second coupling MOS transistor 642 is connected to the drain of the second MOS transistor 1112 in the transformer-coupled oscillator 1110.

It should be noted herein that, to ensure that a line in an accompanying drawing is concise and comprehensible, a connection line between an output end of the multi-phase coupled circuit and the dual-mode oscillator at the next stage is not actually drawn in the diagram of the circuit shown in FIG. 7A and FIG. 7B, and may be determined by a related person according to voltage signs marked in the figure, that is, two endpoints with a same voltage sign are endpoints actually connected. In addition, each transformer-coupled oscillator in FIG. 7A and FIG. 7B is an NMOS transistor-based transformer-coupled oscillator, and in another embodiment, may be replaced with the foregoing PMOS transistor-based transformer-coupled oscillator in FIG. 5.

In a feasible embodiment of this application, the multi-phase coupled circuits in the multi-phase oscillator may be implemented using coupling capacitor pairs. Correspondingly, the module diagram shown in FIG. 6 may be a circuit structure shown in FIGS. 8A-8D.

Referring to FIGS. 8A-8D, still using the multi-phase coupled circuit 640 at the fourth stage as an example, the multi-phase coupled circuit 640 includes a first coupling capacitor C1 and a second coupling capacitor C2. One end (one first coupling end of the multi-phase coupled circuit 640 at the fourth stage) of the first coupling capacitor C1 is connected to a drain of a first MOS transistor 1411 in the dual-mode oscillator at the fourth stage (a corresponding voltage sign is $V_{3+}$), and the other end (one second coupling end of the multi-phase coupled circuit 640 at the fourth stage) of first coupling capacitor C1 is connected to a drain of a second MOS transistor 1112 in the dual-mode oscillator at the first stage (a corresponding voltage sign is $V_{4+}$). One end (the other first coupling end of the multi-phase coupled circuit 640 at the fourth stage) of the second coupling capacitor C2 is connected to a drain of a second MOS transistor 1412 in the dual-mode oscillator at the fourth stage (a corresponding voltage sign is $V_{3-}$), and the other end (the other second coupling end of the multi-phase coupled circuit 640 at the fourth stage) of second coupling capacitor C2 is connected to a drain of a first MOS transistor 1111 in the dual-mode oscillator at first stage (a corresponding voltage sign is $V_{4-}$). Wiring manners of the other three multi-phase coupled circuits may be determined with reference to voltage signs in FIGS. 8A-8D, and details are not described herein.

In another embodiment of this application, the multi-phase coupled circuits in the multi-phase oscillator may alternatively be implemented using coupling inductor pairs or coupling microstrips. For a corresponding circuit diagram, refer to FIGS. 8A-8D (that is, the coupling capacitor pair in FIGS. 8A-8D is replaced with the coupling inductor pair or the coupling microstrips).

In the multi-phase oscillator in the foregoing embodiment, two first coupling ends and two second coupling ends of a multi-phase coupled circuit are all connected to drains of MOS transistors in a corresponding dual-mode oscillator. In another feasible embodiment of this application, the two first coupling ends and the two second coupling ends of the multi-phase coupled circuit may alternatively be connected to gates of MOS transistors in the corresponding dual-mode oscillator, as shown in FIGS. 9A-9D. In a circuit shown in FIGS. 9A-9D, N is still 4, and wiring manners of multi-phase coupled circuits are determined according to voltage signs in FIGS. 9A-9D such that the circuit diagram is concise and comprehensible.

Figure 10:
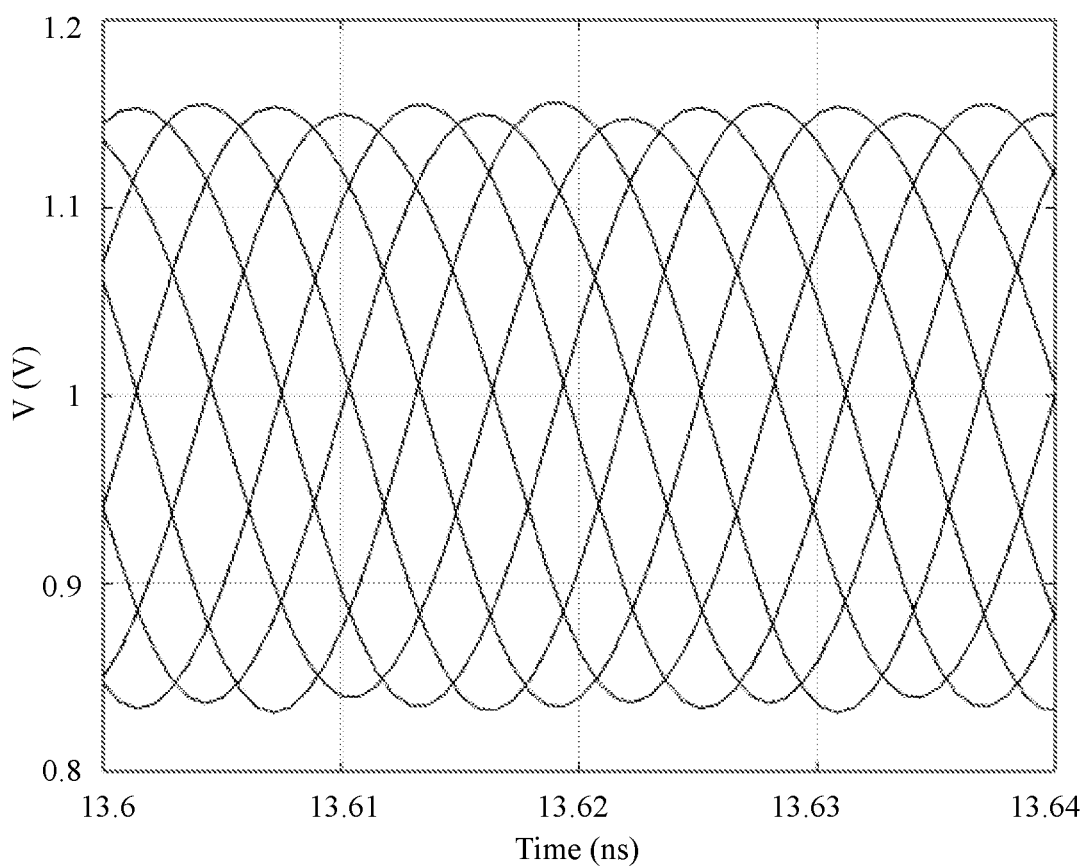
FIG. 10 is a waveform graph of oscillation signals in multiple phases generated by a multi-phase oscillator according to an embodiment of this application.

Based on the circuit shown in FIG. 7A and FIG. 7B, in this embodiment of the present disclosure, a dual-mode eight-phase oscillator is designed using a Complementary MOS (CMOS) procedure. Eight-phase output is implemented by means of circuit post-sim display, and waveforms are shown in FIG. 10 (a horizontal coordinate is time, in unit of nanosecond (ns), and a vertical coordinate is voltage V, in unit of volt (V)), and a frequency range is 29.97 to 37.91 gigahertz (GHz) in an even mode, and 26.03 to 30.51 GHz in an odd mode.

The following Table 1 describes performance comparison between the multi-phase oscillator provided in this embodiment of this application and oscillators (an oscillator ISSCC2013 based on the CMOS procedure, an oscillator ISSCC2013 based on a Silicon Germanium (SiGe) procedure, and an oscillator ISSCC2016 based on the CMOS procedure) disclosed in recent years. Figure of Merit (FoM) means comprehensively considering quality factors of an oscillator such as a frequency, power consumption, and phase noise of the oscillator, and Figure of Merit With Tuning Range (FoM$_T$) means comprehensively considering quality factors of an oscillator a frequency, power consumption, phase noise, and a frequency range of the oscillator. Their expressions are respectively as follows:

$$\text{FoM}=20\ \log(f_0/\Delta f)-\text{PN}-10\ \log(P_{DC}/1\ \text{mW});\ \text{and}$$

$$\text{FoM}_T=20\ \log(f_0/\Delta f\cdot\text{FTR}/10)-\text{PN}-10\ \log(P_{DC}/1\ \text{mW}).$$

In the foregoing formulas, $f_0$ represents an oscillation frequency, $\Delta f$ represents a frequency deviation corresponding to phase noise, Frequency Tuning Range (FTR) represents a frequency tuning range, Phase Noise (PN) represents a phase noise value, $P_{DC}$ represents direct current power consumption, and 1 mW is a unit power value of 1 milliwatt.

TABLE 1

Performance comparison between the oscillators

| | ISSCC2013 | ISSCC2013 | ISSCC2016 | Present Disclosure |
|---|---|---|---|---|
| Procedure | CMOS | SiGe | CMOS | CMOS |
| Supply voltage (V) | 1 | 1.5 | 1.3 | 1 |
| Frequency range (GHz) | 33.6-46.2 | 28-37.8 | 26.5-29.7 | 26-37.9 |
| Frequency range (%) | 31.6 | 29.8 | 11.4 | 37.2 |
| Power consumption (mW) | 9.8 | 10.5 | 38.6 | 11.5 |
| Phase noise @1M (dBc/Hz) | −97 | −103.6 | −106.8 | −103.5 |
| FoM (dBc/Hz) | 180 | 183.9 | 179.4 | 182.9 |
| FoM$_T$ (dBc/Hz) | 189.9 | 193.5 | 180.54 | 194.3 |
| Phase | 2 | 2 | 4 | 8 |

It can be learned from a comparison result in Table 1 that, better FoM and FoM$_T$ are obtained using the CMOS procedure in comparison with another CMOS design. It can be learned that, the oscillator provided in this embodiment of this application can comprehensively satisfy requirements for low power consumption, high phase noise performance, a wide frequency range, and multiple phases, and is advantageous in manufacturing costs.

The foregoing descriptions are implementations of this application, but are not intended to limit the protection scope of this application. The structure in the foregoing embodiment may be applied to the field of integrated circuits. The term "connect" used in the embodiments of the present disclosure indicates a coupling relationship in signal. For example, a signal may be transmitted by connecting one endpoint to another endpoint, and such a connection may include a direct or indirect connection.

What is claimed is:

1. A dual-mode oscillator, comprising:
two transformer-coupled oscillators, wherein each one of the two transformed-coupled oscillators comprises:
a step-up transformer comprising a first input end, a second input end, a first output end, and a second output end, wherein the first input end and the first output end are dotted terminals;
a primary capacitor comprising a first end and a second end, wherein the primary capacitor is coupled to the step-up transformer;
a secondary capacitor comprising a third end and a fourth end, wherein the secondary capacitor is coupled to the step-up transformer; and
a differential metal oxide semiconductor (MOS) transistor pair, wherein the differential MOS transistor pair comprises:
a first MOS transistor comprising:
a first source electrically coupled to a constant-voltage node;
a first drain coupled to the first end and to the first input end; and
a first gate coupled to a third end and to the second output end; and
a second MOS transistor comprising:
a second source electrically coupled to the constant-voltage node;
a second drain coupled to the second end and to the second input end; and
a second gate coupled to a fourth end and to the first output end; and
a mode switching circuit located between the two transformer-coupled oscillators and separately coupled to two drains of the each transformer-coupled oscillator, wherein the mode switching circuit is configured to change an output oscillation frequency range of the dual-mode oscillator using switching.

2. The dual-mode oscillator of claim 1, wherein the first MOS transistor and the second MOS transistor are both N-channel MOS (NMOS) transistors, and wherein the constant-voltage node is either directly grounded or is grounded through a tail current source.

3. The dual-mode oscillator of claim 2, wherein the step-up transformer comprises a primary inductor and a secondary inductor, wherein a center tap of the primary inductor is coupled to a power supply voltage, and wherein a center tap of the secondary inductor is coupled to a gate bias voltage.

4. The dual-mode oscillator of claim 1, wherein the first MOS transistor and the second MOS transistor are both P-channel MOS (PMOS) transistors, and wherein the constant-voltage node is either directly coupled to a power supply voltage or is coupled to the power supply voltage through a tail current source.

5. The dual-mode oscillator of claim 4, wherein the step-up transformer comprises a primary inductor and a secondary inductor, wherein a center tap of the primary inductor is grounded, and wherein a center tap of the secondary inductor is coupled to a bias voltage.

6. The dual-mode oscillator of claim 1, wherein at least one of the primary capacitor and the secondary capacitor comprises a switch capacitor array, a tunable variable capacitance diode, or a combination of the switch capacitor array and the tunable variable capacitance diode.

7. The dual-mode oscillator of claim 1, wherein the mode switching circuit comprises:
a control circuit configured to switch the dual-mode oscillator between an odd mode and an even mode using a mode control signal; and at least two mode capacitors coupled to the control circuit, wherein the output oscillation frequency range is at a first oscillation frequency range in the odd mode when the at least two mode capacitors are equivalent to being bypassed, wherein the output oscillation frequency range is at a second oscillation frequency range in the even mode when the at least two mode capacitors are equivalent to bridging the two drains of the each transformer-coupled oscillators, and wherein the second oscillation frequency range is different from the first oscillation frequency range.

8. The dual-mode oscillator of claim 7, wherein the control circuit comprises:
a first odd mode switch, wherein each end of the first odd mode switch is respectively coupled to the first drain and a drain of a MOS transistor of another transformer-coupled oscillator;
a second odd mode switch, wherein each end of the second odd mode switch is respectively coupled to the second drain and a drain of a MOS transistor of the other transformer-coupled oscillator;
a first even mode switch coupled in parallel to at least one capacitor of the at least two mode capacitors, wherein each end of the first even mode switch is separately coupled to drains of first MOS transistors of the two transformer-coupled oscillators; and
a second even mode switch coupled in parallel to the at least one capacitor of the at least two mode capacitors, wherein each end of the second even mode switch is separately coupled to drains of second MOS transistors of the two transformer-coupled oscillators,
wherein, in the odd mode, the first odd mode switch and the second odd mode switch are turned on and the first even mode switch and the second even mode switch are turned off, and
wherein, in the even mode, the first odd mode switch and the second odd mode switch are turned off and the first even mode switch and the second even mode switch are turned on.

9. The dual-mode oscillator of claim 7, wherein the second oscillation frequency range is lower than the first oscillation frequency range.

10. A multi-phase oscillator, comprising:
N dual-mode oscillators; and
N multi-phase coupled circuits coupled to the N dual-mode oscillators to form a Mobius loop, wherein N is an integer greater than one, wherein each multi-phase coupled circuit is coupled between two dual-mode oscillators, and wherein each one of the N dual-mode oscillators comprises:
two transformer-coupled oscillators, wherein each one of the two transformer-coupled oscillators comprises:
a primary capacitor comprising a first end and a second end;
a secondary capacitor comprising a third end and a fourth end;
a step-up transformer comprising a first input end, a second input end, a first output end, and second output end, wherein the first input end and the first output end are dotted terminals; and
a differential metal oxide semiconductor (MOS) transistor pair comprising:
a first MOS transistor comprising:
a first source coupled to a constant-voltage node;
a first drain separately coupled to the first end and to the first input end; and
a first gate separately coupled to the third end and to the second output end,
a second MOS transistor comprising:
a second source, wherein the second source is coupled to the constant-voltage node;
a second drain coupled to the second end and to the second input end; and
a second gate separately coupled to the fourth end and to the first output end; and
a mode switching circuit located between the two transformer-coupled oscillators and separately coupled to two drains of the each transformer-coupled oscillator, and wherein the mode switching circuit is configured to change an output oscillation frequency range of the dual-mode oscillator using switching.

11. The multi-phase oscillator of claim 10, wherein the N dual-mode oscillators are configured to form N-stages with the N multi-phase coupled circuits, wherein each stage comprises one dual-mode oscillator and one multi-phase coupled circuit, wherein a first coupling end of a multi-phase coupled circuit at a stage is coupled to two drains of any transformer-coupled oscillator in a dual-mode oscillator at the stage, and wherein a second coupling end of the multi-phase coupled circuit at the stage is coupled to two drains of any transformer-coupled oscillator in a dual-mode oscillator at a next stage.

12. The multi-phase oscillator of claim 10, wherein the N dual-mode oscillators are configured to form N-stages with the N multi-phase coupled circuits, wherein each stage comprises one dual-mode oscillator and one multi-phase coupled circuit, wherein a first coupling end of a multi-phase coupled circuit at a stage is coupled to two gates of any transformer-coupled oscillator in a dual-mode oscillator at the stage, and wherein a second coupling end of the multi-phase coupled circuit at the stage is coupled to two gates of any transformer-coupled oscillator in a dual-mode oscillator at a next stage.

13. The multi-phase oscillator of claim 12, wherein the multi-phase coupled circuit comprises a coupling MOS transistor pair, wherein the coupling MOS transistor pair comprises:
a third MOS transistor comprising a third source, a third drain, and a third gate; and
a fourth MOS transistor comprising a fourth source, a fourth drain, and a fourth gate, wherein the third source and the fourth source are coupled and either directly grounded or grounded through a current source, wherein the third drain and the fourth drain are used as the first coupling end of the multi-phase coupled circuit and are coupled to the two drains or the two gates of the any transformer-coupled oscillator in the dual-mode oscillator at a first stage, and wherein the third gate and the fourth gate of the second MOS transistor are used as the second coupling end of the multi-phase coupled circuit and are coupled to either the two drains or the two gates of the any transformer-coupled oscillator in the dual-mode oscillator at the next stage.

14. The multi-phase oscillator of claim 11, wherein each N multi-phase coupled circuit comprises a coupling MOS transistor pair, a coupling capacitor pair, a coupling inductor pair, and a coupling microstrip.

15. The multi-phase oscillator of claim 10, wherein the first MOS transistor and the second MOS transistor are both N-channel MOS (NMOS) transistors, and wherein the constant-voltage node is either directly grounded or is grounded through a tail current source.

16. The multi-phase oscillator of claim 15, wherein the step-up transformer comprises a primary inductor and a secondary inductor, wherein a center tap of the primary inductor of the step-up transformer is coupled to a power supply voltage, and wherein a center tap of the secondary inductor of the step-up transformer is coupled to a bias voltage.

17. The multi-phase oscillator of claim 10, wherein the first MOS transistor and the second MOS transistor are both P-channel MOS (PMOS) transistors, and wherein the constant-voltage node is either directly coupled to a power supply voltage or is coupled to the power supply voltage through a tail current source.

18. The multi-phase oscillator of claim 17, wherein the step-up transformer comprises a primary inductor and a secondary inductor, wherein a center tap of the primary inductor of the step-up transformer is grounded, and wherein a center tap of the secondary inductor of the step-up transformer is coupled to a bias voltage.

19. The multi-phase oscillator of claim 10, wherein at least one of the primary capacitor and the secondary capacitor comprises a switch capacitor array, a variable capacitance diode tunable by a tuning signal, or a combination of the switch capacitor array and the variable capacitance diode tunable by the tuning signal.

20. The multi-phase oscillator of claim 10, wherein the mode switching circuit comprises:
  a control circuit configured to switch the dual-mode oscillator between an odd mode and an even mode using a mode control signal; and
  at least two mode capacitors coupled to the control circuit, wherein the output oscillation frequency range is at a first oscillation frequency range in the odd mode when the at least two mode capacitors are equivalent to being bypassed, wherein the output oscillation frequency range is at a second oscillation frequency range in the even mode when the at least two mode capacitors are equivalent to bridging the two drains of the each transformer-coupled oscillator, and wherein the second oscillation frequency range is different from the first oscillation frequency range.

* * * * *